United States Patent [19]
Mowatt et al.

[11] Patent Number: 5,306,670
[45] Date of Patent: Apr. 26, 1994

[54] MULTI-CHIP INTEGRATED CIRCUIT MODULE AND METHOD FOR FABRICATION THEREOF

[75] Inventors: Larry J. Mowatt, Allen; David Walter, Richardson, both of Tex.

[73] Assignee: Texas Instruments Incorporated, Dallas, Tex.

[21] Appl. No.: 15,510

[22] Filed: Feb. 9, 1993

[51] Int. Cl.[5] ............................................. H01L 21/60
[52] U.S. Cl. .................................. 437/209; 437/211; 437/214; 437/217; 437/220
[58] Field of Search ............... 437/209, 211, 214, 217, 437/220

[56] References Cited
U.S. PATENT DOCUMENTS

| | | | |
|---|---|---|---|
| 4,633,573 | 1/1987 | Scherer | 437/211 |
| 4,874,721 | 10/1989 | Kimura et al. | 437/209 |
| 5,098,864 | 3/1992 | Mahulikar | 437/211 |
| 5,102,829 | 4/1992 | Cohn | 437/217 |
| 5,188,984 | 2/1993 | Nishiguchi | 437/209 |
| 5,206,188 | 4/1993 | Hiroi et al. | 437/211 |

Primary Examiner—Brian E. Hearn
Assistant Examiner—Kevin M. Picardat
Attorney, Agent, or Firm—Rene' E. Grossman; Richard L. Donaldson

[57] ABSTRACT

A multi-chip integrated circuit module includes a supporting layer of laminate material over which a high-density interconnect structure is formed. The laminate layer includes a first upper laminate layer (10) having a hole (14) disposed therein for receiving an integrated circuit chip die (56). A lower core laminate layer (16) having a conductive layer (18) and conductive layer (20) disposed on opposite sides thereof is laminated to the lower surface of the layer (10). Plated-through holes (36), (38) and (40) are formed through the two layers (10) and (16) to connect the conductive layer (20) with a conductive layer (12) on the upper surface of the layer (10). A high-density interconnect layer includes two laminate layers (126) and (138), each having vias formed therethrough and via interconnect structures disposed on the surfaces thereof. The via interconnect structures in the layer (126) allow for connections from the die (56) to the conductive layer (12). The via interconnect structures formed in the layer (138) allow interconnection from the upper surface of layer (138) to via interconnects formed in the layer (126). An I/O connector is interfaced with select ones of the plated-through holes with pins (162) and (164). This allows an interface from the module to an operating system through pins (166).

3 Claims, 6 Drawing Sheets

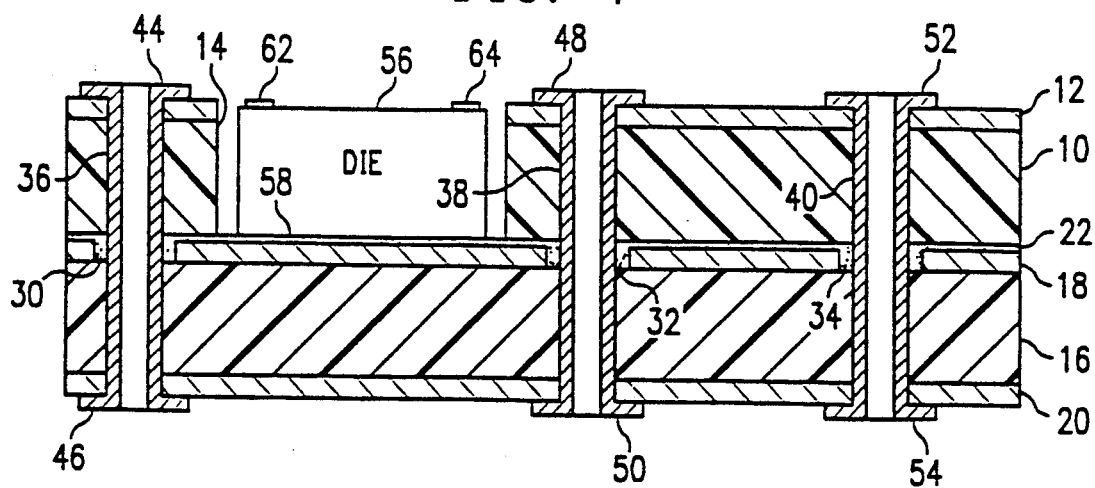
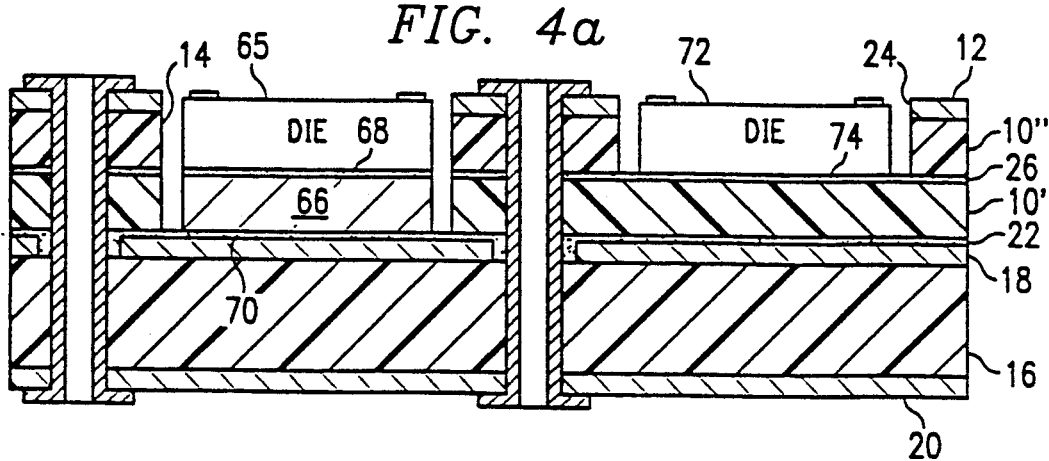
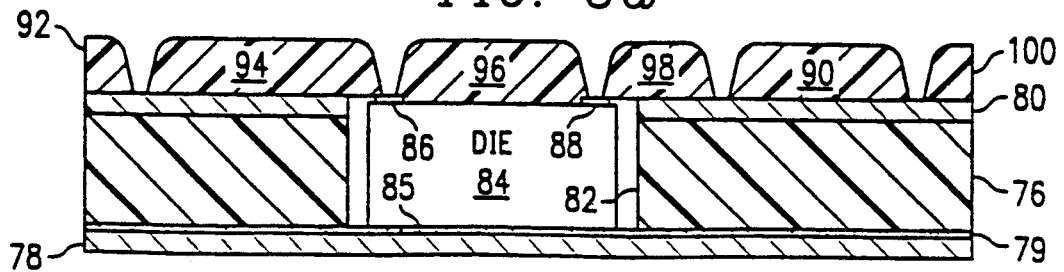

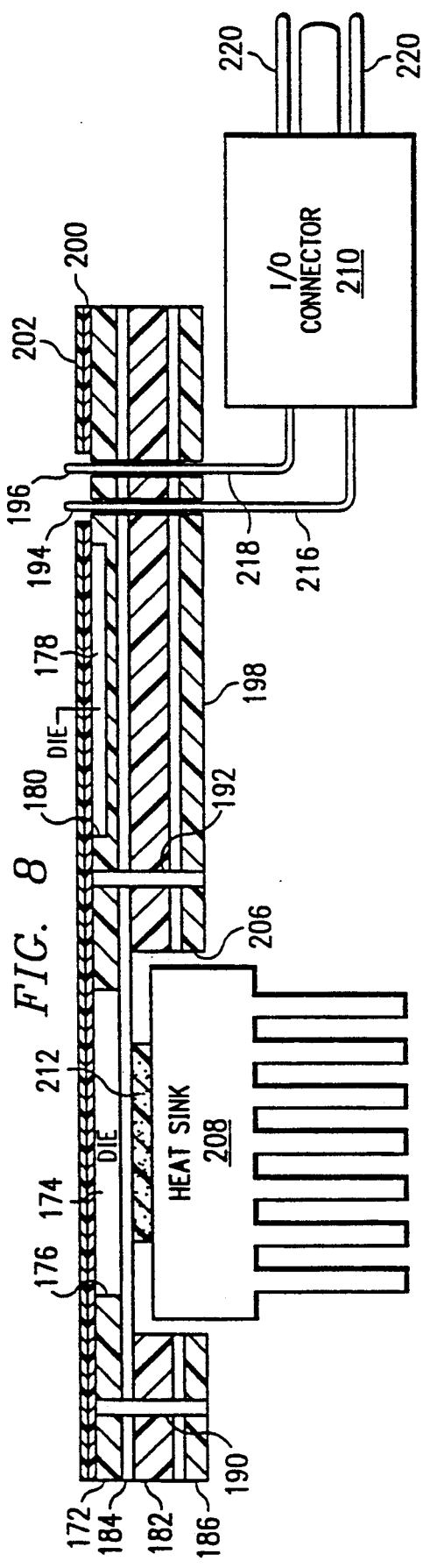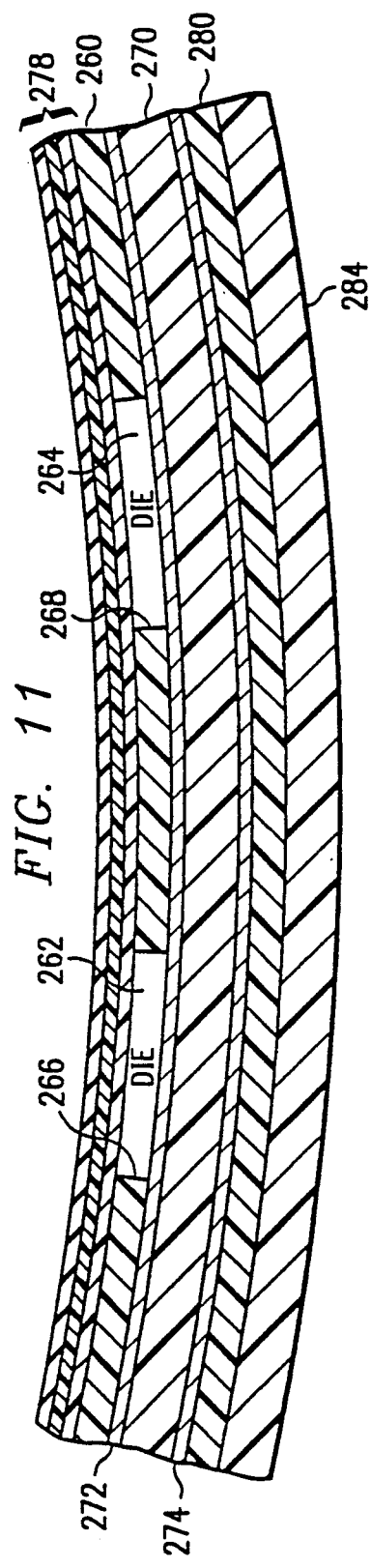

MULTI-CHIP INTEGRATED CIRCUIT MODULE AND METHOD FOR FABRICATION THEREOF

TECHNICAL FIELD OF THE INVENTION

The present invention pertains in general to packaging of semiconductor components, and more particularly, to packaging of multiple semiconductor die in a laminated substrate with an interconnect layer formed in a deposited overlay structure.

BACKGROUND OF THE INVENTION

Interconnection of electronic devices has become a significant factor in determining the performance of electronic systems in recent years. This is due in part to the trend toward higher device integration, i.e., large scale integrated circuits with several million active transistor elements, sub-micron feature sizes and I/O pinouts approaching 400-500 connections, along with the associated increase in silicon real estate size, typically greater than 0.50 inches, and power dissipations of greater than five watts per IC. These factors certainly pose major technology problems for the electronics packaging engineer, especially in the area of single chip packaging. Present IC packaging design approaches, material systems, and technologies for single chip packaging have become, in the high-end integrated circuits, significant performance differentiators and, as such, comprise major product differentiators.

The emerging need to integrate off-chip interconnect with tailored electrical characteristics of controlled impedance transmission lines, low-loss power and ground distribution networks and minimal signal paths has driven the present leading edge subsystem components to consider a form of electronics packaging known within the industry as Multi-Chip Modules, or MCM. An MCM typically constitutes the ability to package multiple bare ICs in a single subsystem package, where chip-to-chip interconnect is supported by one of a number of high performance interconnect approaches internal to the next system packaging level interface. There are at present three major classes of MCM packaging approaches.

The first class of MCM has come to be known as MCM-L, where the "L" stands for Laminate technology. This approach typically consists of an extension of standard printed wiring board technology that supports fine dimension surface features to enable 6-10 mil lead pitch interfaces for a perimeter pad device to provide for the interconnect. Electrical connections for a plurality of ICs are generally made with a Tape Automated Bonding (TAB) lead interface from the outer perimeter bond pads on the device to a fine lead pitch perimeter pad interfaced on the Laminate technology interconnect. When multiple bare ICs having TAB lead frames attached to the I/O bond pads are interconnected with this approach, an MCM system is created; hence, the term MCM-L. Alternate methods of device-to-Laminate interconnect electrical connection can be used. For example, bare chip wire bond connections and either solder bump or electrically conductive adhesive bonds are in use or in development within the industry. This technology has become accepted as a low-cost manufacturing approach for the low-to-mid range performance (typically 20-70 MHz clock frequency) products and has the significant advantages of availability, low-cost, low-risk and the ability to leverage existing packaging technology into the emerging high-volume MCM packaging applications.

The second class of MCM packaging technology is known as MCM-C. This approach is an extension of both the hybrid practice, where "thick film" metallizations can be screen printed and then fired in multiple layers on a ceramic substrate, and the multi-layered co-fired single chip packaging technologies, where screened metallizations are printed on ceramic in the "green tape" or pre-fired state and the ceramic tape and metallization are cured in a single process. In either case, an interconnect of several layers is formed on a ceramic substrate, which can also serve as a package to interconnect to the next system level, and a plurality of ICs can then be connected to this wiring structure by a variety of techniques. Among the methods for IC connection that are utilized are: wire bond, flip chip solder bump, TAB, thermal compression bond, TAB solder interface and electrically conductive polymer adhesive. This technology has the advantage of significant leverage of an installed base of ceramic interconnect manufacturing due to its reliance on extensions of single chip packaging technologies and hybrid interconnect technologies. However, there are penalties in interconnect wiring densities due to the limitations in feature sizes that can be achieved, and in general the electrical performance characteristics of the ceramic wiring substrate, which present limitations not suitable for leading technology IC interconnect.

The third class of MCM packaging technology is known as MCM-D, where "D" stands for Deposited (metallization). This approach leverages thin film process techniques that are typically extensions of IC manufacturing processes. Because of this, interconnect feature sizes much finer than the present art MCM-L or MCM-C features are achievable. MCM-D interconnects are typically constructed of dielectric layers of polyimide based materials with either aluminum or copper and barrier metal conductors in multiple layer structures. These thin film multi-layer MCM-D wiring interconnects are built using a variety of materials for mechanical substrates, which provide a manufacturing tooling plate for processing, and mechanical and thermal structures for next level package interface. Substrate materials that can be used include silicon, ceramics, glass and metal matrix composite materials. MCM-D thin film interconnects generally display the best attributes of electrical performance characteristics in the smallest packaging size and thermal penalty attributes. However, they also exhibit the highest manufacturing costs at present and due to this, are limited for consideration to only the interconnect applications that demand the highest electrical and mechanical packaging solutions.

SUMMARY OF THE INVENTION

The present invention disclosed and claimed herein comprises a multi-chip integrated circuit package. The package includes a substrate having upper and lower surfaces and being fabricated from a polymer material. The substrate has a lower conductive surface disposed on a lower side thereof. A plurality of cavities are formed on the upper surface of the substrate for receiving integrated circuit chips and being of sufficient depth that when the integrated circuit chips are disposed therein, the upper surface of the integrated circuit chips disposed therein substantially co-planar with the upper surface of the substrate. The integrated circuit chips have bonding pads associated therewith which are disposed on the upper surface of the integrated circuit chips. An interconnect is provided that conductively connects between a conductive pad on the upper surface of the substrate and the lower conductive surface. A layer of interconnect laminate film is disposed over the upper surface of the substrate and the integrated circuit chips with a plurality of via openings disposed therein. The via openings are disposed such that they expose select ones of the bonding pads and the conductive pad. A pattern of interconnect conductors is disposed on the top of the laminate film so as to extend between at least some of the via openings and provide electrical connections between select ones of the bonding pads and the conductive pads.

In another aspect of the present invention, the substrate is comprised of a first polymer layer and a second polymer layer. The first polymer layer has a first conductive layer disposed on the upper surface thereof and is operable to contain a plurality of cavities. The cavities extend from the upper surface of the first conductive layer to the lower surface of the first polymer layer. The second polymer layer has a second conductive layer disposed on the upper surface thereof and a third conductive layer disposed on the lower surface thereof, the third conductive layer comprising the lower conductive layer of the substrate. An adhesive layer adhesively attaches the lower surface of the first polymer layer to the upper surface of the second conductive layer. The sheet resistance of at least one of the second and third conductive layers is substantially lower than the sheet resistance of the pattern of interconnection conductors.

In yet another aspect of the present invention, a plurality of conductive pads are disposed on the upper surface of the first conductive layer and the interconnect is comprised of a plurality of plated-through holes, each of the plated-through holes extending from one of the conductive pads to the third conductive layer and extending through the first and second polymer layers and the second conductive layer.

In a further aspect of the present invention, an input/output connector is provided having a body support on the substrate with a plurality of substrate pins and a plurality of system pins. The substrate pins are operable to be inserted into select ones of the plated-through holes of which select ones thereof are isolated from the third conductive layer, and which plated-through holes have an input/output function associated therewith. The system pins are operable to interface between the substrate pins and an external system, the substrate pins operating in a removable manner with respect to the external system. The system pins allow signals and power supply voltages to be provided to the plated-through holes and, subsequently, to the pattern of interconnection conductors. In one embodiment, the third conductive layer comprises a ground plane or a power supply plane.

BRIEF DESCRIPTION OF THE DRAWINGS

For a more complete understanding of the present invention and the advantages thereof, reference is now made to the following description taken in conjunction with the accompanying Drawings in which:

FIG. 4 illustrates the structure of FIG. 3 after the formation of plated-through holes and a die disposed in the die cavity;

FIG. 4a illustrates an alternate embodiment of FIG. 4 illustrating different mounting techniques for the die;

FIGS. 5a-5c illustrate the steps for forming a high-density interconnect layer on the upper surface of a substrate/IC combination;

FIG. 8 illustrates a cross-sectional view of the multi-chip module with a connector and heat sink integrated therein;

FIG. 11 illustrates an alternate embodiment wherein the multi-chip module is integrally molded into an arcuate surface.

DETAILED DESCRIPTION OF THE INVENTION

Figure 1:
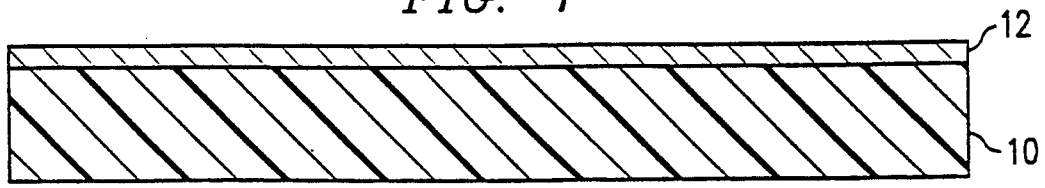
FIG. 1 illustrates a cross-sectional view of the metal clad laminate substrate.

Referring now to FIG. 1, there is illustrated a cross-sectional diagram of a Printed Wiring Board (PWB) laminate substrate. The substrate is comprised of a layer 10 of PWB laminate material that has a layer 12 of copper clad thereto. The PWB laminate material may be in an epoxy glass material, or polyimide glass material, teflon or other materials commonly used in PWB fabrication. These are conventional materials utilized for PWB laminate material and can be generally referred to as polymer materials. The thickness of the layer 10 is approximately 15-20 mils and the copper layer 12 is approximately 0.7-1.4 mils. The layer 12 is adhered to the layer 10 in a conventional copper cladding technique.

Figure 2:
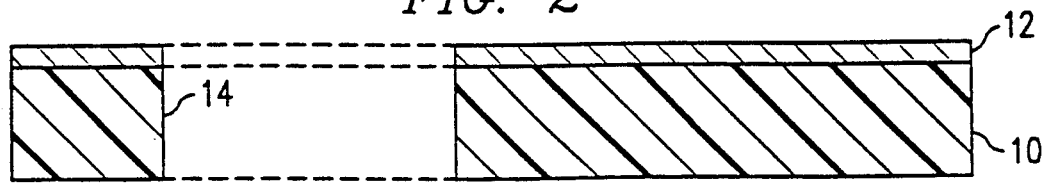
FIG. 2 illustrates a cross-sectional view of the substrate with the die receiving hole formed therein.

Referring now to FIG. 2, there is illustrated a cross-sectional diagram of the substrate of FIG. 1, wherein a hole 14 is formed through the substrate removing a corresponding portion of layer 12 and layer 10. As will be described hereinbelow, the hole 14 is slightly larger than a semiconductor die that will be disposed therein. Further, the thickness of the combined layers 10 and 12, and subsequent underlying adhesive layers, is such that the surface of the semiconductor die will be co-planar with the upper surface of the layer 12. By forming the hole 14 at this stage, complex and expensive milling or etching procedures can be eliminated.

Figure 3:
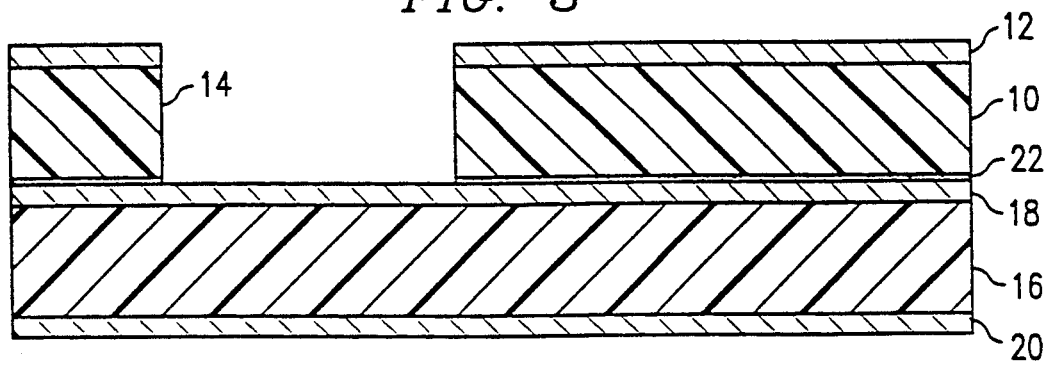
FIG. 3 illustrates a cross-sectional view of the substrate incorporating a second supporting laminate layer.

Referring now to FIG. 3, there is illustrated a cross-sectional diagram of the substrate of FIG. 2, disposed on a second PWB laminate substrate that is comprised of a laminate layer 16, an upper copper clad layer 18 and a lower copper clad layer 20. Again, the thickness of layers 18 and 20 is approximately 0.7-1.4 mils with the layer 16 allowed to be thicker, depending upon the desired properties, such as support. The upper surface of the layer 18 is laminated to the lower surface of the laminate layer 10 in a conventional lamination process that provides an adhesive layer 22 that is approximately 3 mils thick. Adhesive is not present in the location of the die. In this process, the adhesive layer 22 is typically formed of the same material as the laminate layer 10 with the exception that it is in an uncured state. For example, if the laminate layer 10 were manufactured with a polyimide material, then the adhesive would be a polyimide adhesive. This lamination procedure is performed at a pressure of approximately 200 PSI or greater with a temperature in the range of 350°-375° F. This is a conventional process.

The structure of FIG. 3 provides for an upper interconnect level at the layer 12 which can contain a signal or it can contain ground. The layer 18, as will be described hereinbelow, acts as a thermal plane and/or a signal plane. The layer 20 can be utilized to provide for signal, ground or power. Therefore, each of the copper layers 12, 18 and 20 provide a highly conductive layer that can be patterned to carry signal or to provide a ground or power plane.

Figure 3A:
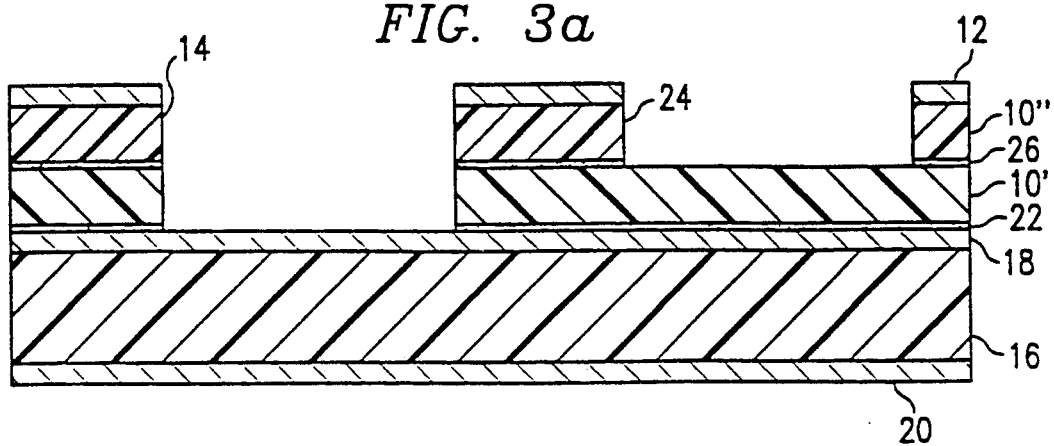
FIG. 3a illustrates an alternate embodiment of FIG. 3 illustrating cavities for receiving different thicknesses of die.

Referring now to FIG. 3a, there is illustrated an alternate embodiment of the structure of FIG. 3. In the structure of FIG. 3a, the layer 10 is fabricated from two separate layers of PWB laminate material, a layer 10' and a copper clad layer 10". The copper clad layer 10" has the copper layer 12 clad to the upper surface thereof. A hole 24 is then punched through the surface of the layer 10" and layer 12 which will receive a die that is thinner than that disposed in hole 14 in FIG. 3. Thereafter, the layer 10" and copper layer 12 are laminated to the layer 10' with an adhesive layer 26. The hole 14 is then formed in the combined layer 10' and 10" with the overlying copper layer 12. The thickness of the layers 10', 10" and 26 are substantially equal to the thickness of the layer 10 in FIG. 3. By utilizing this structure, a thinner die can be accommodated in the hole 24 as compared to the hole 14. It should also be noted that the depth of the hole 14 down to the upper surface of the copper layer 18 will approximately equal the thickness of a die and the associated adhesive layer to allow the upper surface of the die to be co-planar with the upper surface of the copper layer 12. Similarly, the thickness of the thinner die and its adhesive layer that will be disposed in hole 24 is approximately equal to the thickness of the copper layer 12, the laminate layer 10' and the adhesive layer 26, such that the upper surface of the thinner die will also be co-planar with the upper surface of the copper layer 12.

Referring now to FIG. 4, there is illustrated a cross-sectional diagram of the structure of FIG. 3 with plated-through holes formed therein. The plated-through holes are formed by first drilling holes through selected regions of the upper surface of the copper layer 12 and downward through the laminate layer 10, the copper layer 18, the laminate layer 16 and the copper layer 20. Note that these holes will have a conductive layer disposed on the sides thereof. Therefore, if the plating material that is disposed on the sidewalls of the holes were to contact the conductive layer 18, this would result in the conductive layer 18 being at the same potential as the conductive layer 20. This may be undesirable. Therefore, the conductive layer 18 would require patterning and etching in the initial board manufacturing process to define isolated regions through which the plated-through holes can later be formed. Three regions 30, 32 and 34 are illustrated through which three holes 36, 38 and 40 are formed.

After formation of the holes 36, 38 and 40, an electrolysis copper deposition of a seed metallization if performed, followed by an electrolytic plating process of copper. This results in the formation of a layer of copper over both the lower exposed surface of the conductor layer 20 and the upper exposed surface of the layer 12 in addition to the entire surface of the holes 36, 38 and 40. Thereafter, the structure is patterned and etched to define pads and/or I/O routing associated with each of the plated-through holes 36-40. This will result in a pad 44 being formed on the upper surface of copper layer 12 and a pad 46 being formed on the lower surface of the conductive layer 20 associated with the hole 36. Similarly, the hole 38 has a pad 48 formed on the upper surface of layer 12 and a pad 50 formed on the lower surface of the layer 20 associated therewith, and the hole 40 has a pad 52 formed on the upper surface of the layer 12 and a pad 54 formed on the lower surface of the layer 20 associated therewith.

Once the plated-through holes are formed, the structure is then ready to receive integrated circuits and have a high-density interconnect layer associated therewith. Typically, the process up to this stage is performed at a printed wiring board facility utilizing standard construction techniques. The board can then have any pattern etched on the upper surface of the layer 12 and the lower surface of the layer 20. However, since the layer 18 is sandwiched between the two layers 10 and 16 during the lamination process, it must be patterned prior to completion of the plated-through holes. After any patterning operations on the upper surface of the layer 12 are completed, a semiconductor die 56 is disposed in the hole 14 and adhered to the exposed surface of the layer 18 with a layer of adhesive 58. The adhesive layer 58 can be any type of conventional adhesive. For example, for a relatively large die, a compliant adhesive could be utilized to provide an adequate Co-Efficient of Thermal Expansion (CTE), which adhesive layer 58 could be either electrically conductive, thermally conductive, or both, depending upon the application. As described above, the conductive layer 18 provides a thermally conductive plane, but can also provide an electrically conductive plane. The die 56 is mounted such that the bond pads face upwards, there being illustrated two bond pads 62 and 54.

Referring now to FIG. 4a, there is illustrated an alternate embodiment of the structure of FIG. 4 and the mounting of the die therein, utilizing the structure of FIG. 3a, wherein the two layers 10' and 10" were utilized in the lamination process to form the thinner hole 24. The plated-through holes 36 and 38 are formed as described above with reference to FIG. 4 with the cavity 24 formed between the plated-through holes 38 and 40 (not shown). In the hole 14, a die 65 is disposed on a spacer or "slug" 66 with a layer of adhesive 68. The combined die 65 and slug 66 are then attached to the exposed surface of the conductive layer 18 with an adhesive layer 70. In this configuration, the thinner die 64 can be accommodated in the hole 14 with the use of the slug 66. The hole 24, as described above, accommodates a thinner die 72, which is disposed directly on the exposed surface of a layer 10' with an adhesive layer 74.

Figure 5B:
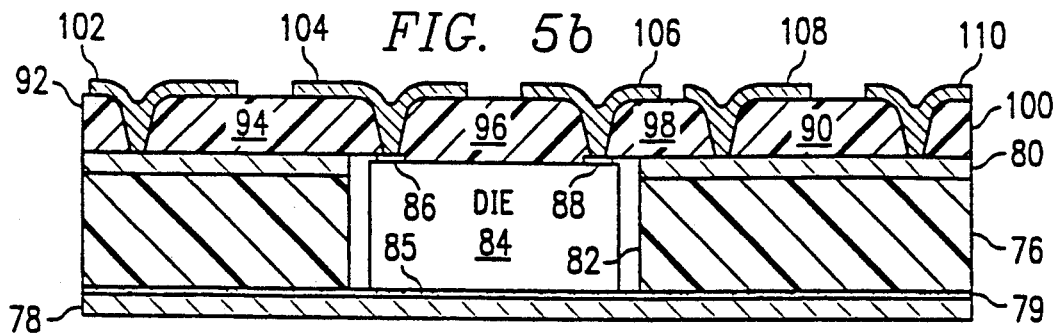
Figure 5C:
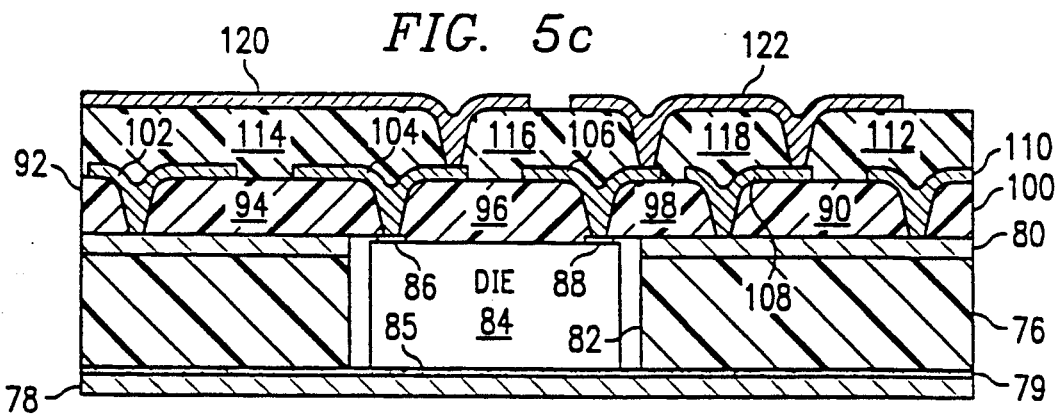

Referring now to FIGS. 5a-5c, the process for forming a High Density Interconnect layer (HDI) will be described. This is a conventional process which is described in U.S. Pat. No. 4,783,695, issued to C. W. Eichelberger on Nov. 8, 1988. With specific reference to FIG. 5a, a laminate layer 76 is provided that is formed similar to the laminate layer 10, with a conductive layer 80 disposed on the surface thereof and a conductive layer 78 disposed on the lower surface thereof, the conductive layer 78 laminated to the lower surface of the layer 76 with an adhesive layer 78. The layer 78 is similar to the layer 18 in that it is associated with a lower laminate layer (not shown) similar to layer 16. A hole 82 is formed in the combined laminate layer 76 and conductive layer 80, similar to the formation of the hole 14. A die 84 is disposed in the hole 82 and adhesively attached to the exposed portion of the conductive layer 78 with an adhesive layer 85. The die 84 has two bond pads 86 and 88 illustrated that face upwards, the upper planar surface of the die 84 being substantially co-planar with the upper surface of the conductive layer 80.

A dielectric film, which may be Kapton ® polyimide, available from E. I. du Pont de Neumors Company, is disposed on the surface of the conductive layer 80. This layer has a thickness of approximately 0.5–3.0 mils. This dielectric film is treated to promote adhesion by Reactive Ion Etching (RIE) and then coated with a thermoset adhesive such as Siloxide Polymide epoxy. This adhesive coated film is then laminated across the top of the die 84, any other components and the upper surface of the copper layer 80 with the thermoset material servicing as an adhesive to hold the Kapton ® layer 90 in place.

After the Kapton ® layer 90 has been laminated to the upper surface of the substrate and the associated die 84, vias 92, 94, 96, 98 and 100 are formed through the layer 90 to expose select portions of the upper surface of the copper layer 80 and the bond pads 86 and 88. The vias 94 and 96 are associated with the bond pads 86 and 88, respectively. Typically, these vias 92–100 are formed by laser drilling in alignment with the selected areas of the substrate underlying the Kapton ® layer 90. There are a number of techniques described to perform this laser drilling. A pulsed laser could be utilized to generate openings in the Kapton ® layer 90 or, alternatively, a scanning laser beam could be utilized. With the pulsed laser, the openings in layer 90 are made by a single step ablation of an opening through the film 90. Once this step is completed, the appropriate vias 92–100 will be formed through the layer 90, which will permit electrical connections to be made to the underlying exposed surfaces.

Referring now to FIG. 5b, the next step of the process for forming the HDI layer, that for forming the metal interconnect pattern is described. The metallization is provided by first sputtering a conformal metal layer of titanium/copper to a thickness of approximately 4000 Angstroms. A layer of copper is then electroplated onto the titanium/copper layer to a thickness of approximately 4 microns. Thereafter, the surface of this layer is then patterned by spraying, laminating or plating on a coating of photoresist, drying this layer for a predetermined amount of time at a temperature of approximately 80°–90° C. and then exposing the resist layer with a conventional imaging tool, such as a scanned laser.

After development of the photoresist, the desired metallization pattern is then etched using an appropriate etching process to define via interconnects 102, 104, 106 and 110 for each of the vias 92–100, respectively. This provides for a second level of interconnect that is separate from the level of interconnect provided by the conductive layer 80.

Referring now to FIG. 5c, there is illustrated a detail of the formation of a next and higher level interconnect than the level provided by the interconnect layer formed on the upper surface of the layer 90. This next and higher level interconnect is formed by first performing an adhesion promote and cleaning step utilizing RIE on the upper surface of the structure of FIG. 5b. A second layer of Kapton ® 112 is then laminated to the upper surface of the structure of 5b with an appropriate thermoset adhesive, this being performed at a relatively low pressure and low temperature. Thereafter, a via 114 is formed in the upper surface of the layer 112, exposing a portion of the interconnect structure associated with the via interconnect 104, a via 116 is formed, exposing a portion of the interconnect structure associated with the via interconnect 106, and a via 118 is formed, exposing a portion of the interconnect structure associated with the via interconnect 108. A conformal layer of copper is then formed on the upper surface of layer 112 in accordance with the process described above and then patterned and etched to form the next interconnect level. This will result in a via interconnect 120 that contacts via interconnect structure 104 and the bond pad 86. Similarly, an interconnect structure 122 is provided which is formed in both of vias 116 and 118 to contact both the via interconnect structure 108 and the via interconnect structure 108. If another interconnect layer is required, the same process can be repeated. In general, this procedure is described in U.S. Pat. No. 5,073,814 and also in U.S. Pat. No. 4,783,695.

Figure 6:
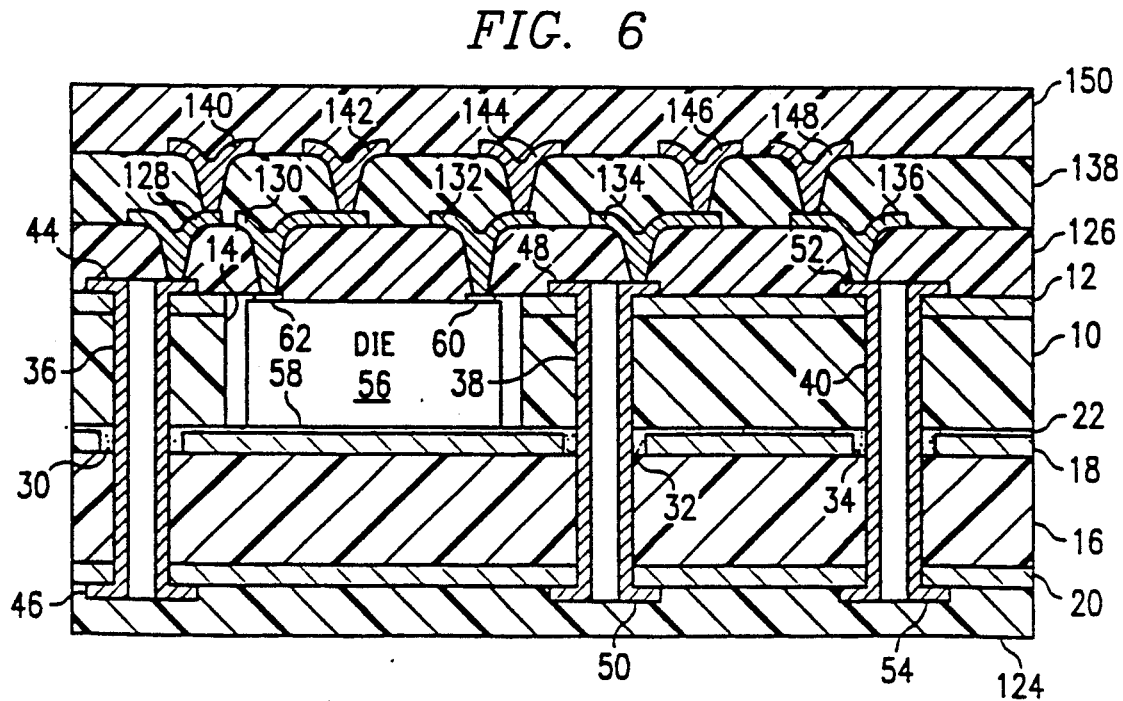
FIG. 6 illustrates the structure of FIG. 4 with the high density interconnect overlay disposed on the upper surface thereof.

Referring now to FIG. 6, there is illustrated a cross-sectional view of the structure of FIG. 4 with the HDI structure formed on the upper surface thereof. In the first step of the process, a Kapton ® layer 124 is laminated onto the lower surface of the copper layer 20 and then a Kapton ® layer 126 is laminated onto the upper surface of the copper layer 12 and the pads 44, 48 and 52. Vias are then formed in the Kapton ® layer 126 and via interconnect structures 128, 130, 132, 134 and 136 formed therethrough. The via interconnect 128 contacts the pad 44 of the plated-through hole 36, the via 134 contacts the pad 48 associated with the plated-through hole 38 and the via interconnect 138 contacts the pad 52 associated with the plated-through hole 40. The via interconnects 130 and 132 contact the bond pads 62 and 64. A second layer of Kapton ® 138 is laminated to the upper surface of the layer 126 and the interconnect structures 128–136. Vias are then formed therethrough and via interconnects 140, 142, 144, 146 and 148 formed therein to contact the via interconnects 128–136, respectively, in the layer 126. Although not illustrated, each of the via interconnect structures on the upper surface of the layer 126 and the upper surface of layer 138 has a pattern associated therewith to define the overall interconnect structure between various points on the respective surfaces to interconnect to other integrated circuits, etc. After the highest level of interconnect structure is formed, a layer of solder mask is deposited on the surface to provide a protective covering and function as a passivation layer. Alternatively, another layer of Kapton ® could be laminated to the structure, but this would not be cost-efficient. The overall HDI structure will therefore result in a first interconnect layer, associated with the Kapton ® layer 126 that is approximately 1.5 mils thick, a second interconnect layer associated with the Kapton ® layer 138, that is approximately 1.5 mils thick and the solder mask layer 150 that is approximately 1 mil thick, resulting in an HDI layer of approximately 4 mils in thickness.

Figure 7:
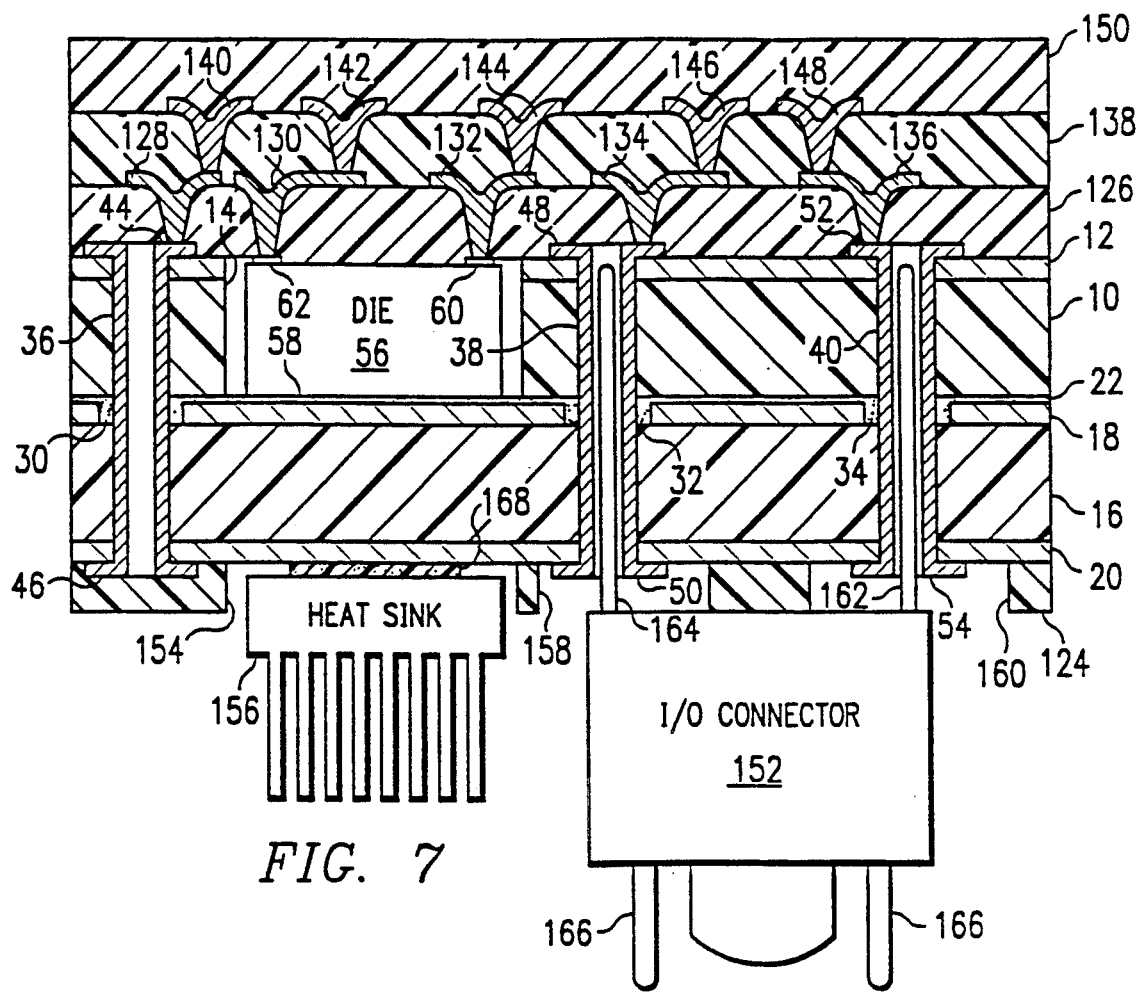
FIG. 7 illustrates the structure of FIG. 6 with an I/O connector and heat sink interfaced therewith.

Referring now to FIG. 7, there is illustrated a cross sectional diagram of the structure of FIG. 6, with the addition of an I/O connector 152 and a heat sink 156. In order to accommodate the connector 152 and the heat sink 156, the Kapton ® layer 124 protecting the lower surface of the copper layer 20 is ablated with a laser. This will result in an opening 154 being formed substantially under the die 56. Additionally, two openings 158 and 160 are formed for exposing the lower end of the plated-through holes 38 and 40 and the associated pads 50 and 54, respectively. The I/O connector has two pins 162 and 164 that are operable to be inserted into the opening through the plated-through holes 38 and 40 with a diameter that is typically slightly larger than the inner diameter of the holes after plating. This allows a relatively snug fit. The pins 162 and 164 can either be a press-fit or they can be soldered. The I/O connector 152 is a fairly conventional connector that is utilized to provide connection to a system through system pins 166. The heat sink 156 is adhesively attached with a layer of adhesive 168 to the exposed surface of the copper layer 20 in the opening 154. This adhesive layer 168 is thermally conductive.

Figure 7A:
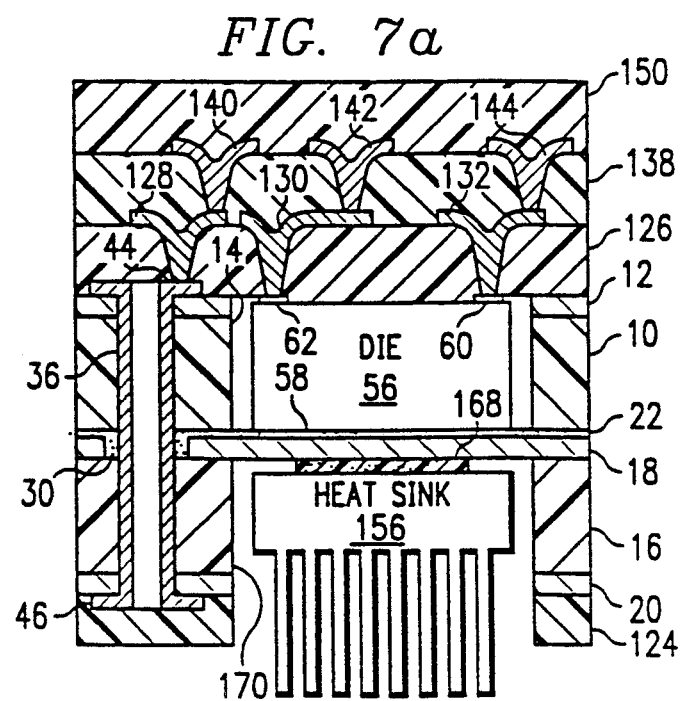
FIG. 7a illustrates an alternate embodiment of the structure of FIG. 7 illustrating a different mounting configuration for the heat sink.

Referring now to FIG. 7a, there is illustrated a detail of the structure of FIG. 7, illustrating an alternate mounting technique for the heat sink 156. In the initial fabrication of the layer 16 and the copper layer 20, a hole 170 is punched through or formed therein. This results in the lower surface of the conductive layer 18 being exposed. This allows the heat sink 156 to be attached directly to the copper layer 18 with the adhesive layer 168 to provide a more efficient transfer of heat and thus remove the thermal resistance of the layer 16.

Referring now to FIG. 8, there is illustrated a cross-sectional view of a multi-chip module manufactured in accordance with the present invention described hereinabove. The structure includes a primary laminate layer 172 having a first die 174 disposed in a first cavity 176 and, a second die 178 disposed in a second cavity 180. The cavity 180 is shallower than the cavity 176 and therefore, the laminate layer 172 is fabricated similar to that illustrated in FIG. 3a. The primary laminate layer 172 is laminated to a second supporting substrate layer comprised of a laminate layer 182, an upper conductive layer 184 and a lower conductive layer 186, the primary layer 172 laminated to the upper conductive layer 184. Plated-through holes 190, 192, 194 and 196 are then formed such that they connect the conductive layer 186 to the upper surface of the primary laminate layer 172, which laminate layer could have a conductive copper layer disposed thereon to provide an interconnect layer at that level. Additionally, the layer 184 could be patterned and etched and layer 186 could be patterned and etched such that some of the plated-through holes 190–196 connect one or the other of the conductive layers 184 and 186. After formation of the plated-through holes 190–196, a Kapton ® layer 198 is disposed on the lower surface of the conductor layer 186 and then two layers of interconnect, layer 200 and layer 202, are formed on the upper surface of the primary layer 172 in accordance with the HDI process described hereinabove.

After formation of the HDI layers 200 and 202 and the Kapton ® layer 198, the lower surface of the module is processed to provide openings to each of the plated-through holes 190–196 and also to form an opening 206 to receive a heat sink 208. The openings associated with each of the plated-through holes 190–196 are all formed at the same time with a laser ablation or other compatible process. The purpose of this is to allow access for the pins of an I/O connector 210. Thereafter, a laser ablation process is utilized to form the opening 206 and then heat sink 208 attached to the exposed surface of the conductive layer 184 with an adhesive layer 212. The upper surface of the module on the upper surface of the HDI layer 202 and the associated passivation layer is then processed to expose the plated-through holes 194 and 196, the plated-through holes 194 and 196 functioning as the I/O pins for the module. This allows the I/O connector 210 and associated pins 216 and 218 to be inserted therethrough with either a press-fit or a soldered connection, therefore integrating the I/O connector 210 with the module.

In one embodiment, the conductive layer 186 provides the supply voltage $V_{cc}$ and the conductive layer 184 provides the ground plane and also the thermal plane for removing the heat from the dies 174 and 178. The laminate layer 182 is significantly thicker than the primary layer 172, since the primary layer 172 functions to provide a support layer for the HDI layers 200 and 202 and is substantially the same thickness as the die 174. The laminate layer 182 provides a support function for the overall module and can therefore be considerably thicker. The I/O connector is therefore supported through the associated plated-through holes 194 and 196 on the entire module, primarily the laminate layer 182. It can be seen that the connector 210 is disposed parallel to the lower surface of the module with the pins 216 and 218 extending at a right angle therefrom. System pins 220 then interface with the system. It can be seen that with the structure of the present invention, there is only a single interconnect layer disposed between the dies 174 and 178 and the plated-through holes 194 and 196 that interface with the pins on the I/O connector 210. This is a significant reduction in interconnect levels.

It can be seen that the multi-chip module utilizes substrates that are manufactured from lost-cost polymer material, which low-cost polymer material has a fairly high thermal resistance. When such material is utilized, some type of thermal plane must be utilized. This thermal plane is provided by the conductive layer 184. Further, the ability to attach the die 174 directly to the thermal plane in the form of the conductive layer 184 allows for adequate heat dissipation. Additionally, the conductive layers 184 and 186 allow for distribution of both the power supply voltage and ground. Since the polymer material during fabrication can accommodate significantly thicker layers of metal, especially the layer 184, a much lower sheet resistance is realized, as compared to the sheet resistance of the interconnect layers 200 and 202. The interconnect layers 200 and 202 are utilized for the very fine definition, high density interconnects, whereas the connective layers 184 and 186 provide for distribution of the power supply voltage and ground.

Figure 9:
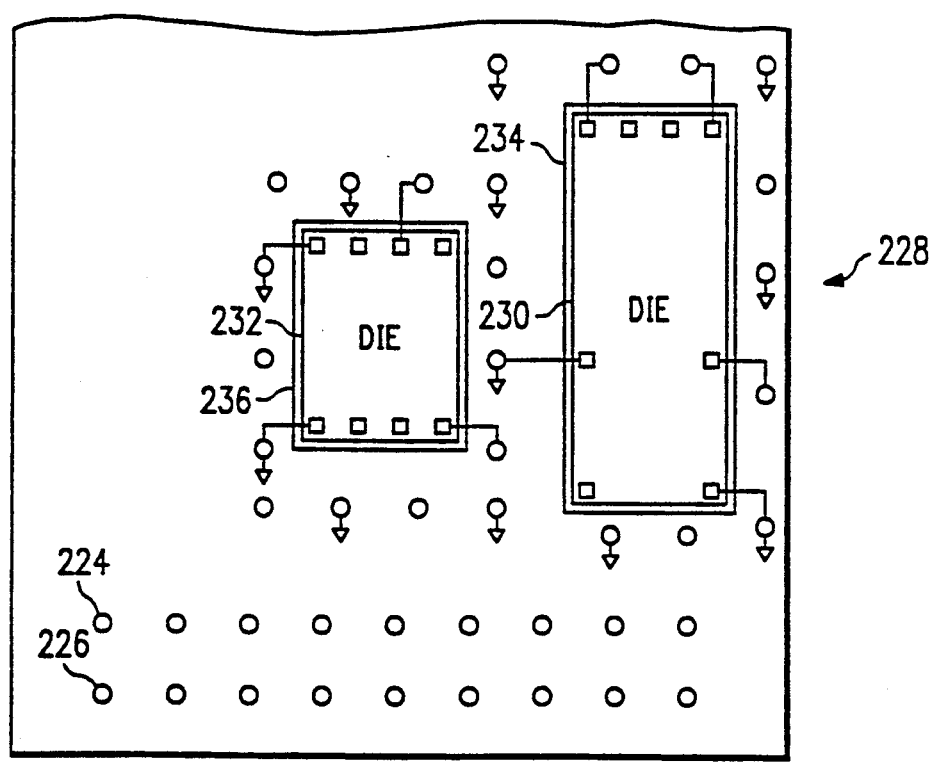
FIG. 9 illustrates a top view of the first interconnect layer illustrating one arrangement of the plated-through holes for accessing the ground and $V_{cc}$ planes.

Referring now to FIG. 9, there is illustrated a top view of the module, illustrating in a schematic form the arrangement of the plated-through holes that provide both ground plane connection and $V_{cc}$ plane connection and also the arrangement for the I/O pins. The I/O pins are typically disposed at the end of the substrate in pairs such that a row of plated-through holes 224 and a row of plated-through holes 226 will be arranged in a parallel manner with the edge of a module 228. The I/O connector pins 216 and 218 will be disposed in the plated-through holes 224 and 226. Similarly, the module 228 has two dies 230 and 232 illustrated which are disposed in cavities 234 and 236, respectively. The cavities 234 and 236 have plated-through holes disposed thereabout that provide a pattern of variously dispersed ground and power supply connections, the ground connections illustrated with a ground symbol. Typically, an integrated circuit die may have a large number of ground and $V_{cc}$ pads. Typically, packaging engineers have had to provide a relatively large number of pins on the package to accommodate the current requirements of the die. Therefore, each of the bonding pads would be required to go through a first level of interconnect, i.e., a wire bond to the package, and then be routed through one of a plurality of pins to the supporting structure, i.e., a printed circuit board. With the module of the present invention and the ability to provide a distributed ground plane and distributed $V_{cc}$ plane, the plated-through holes can be placed at multiple locations about the cavities 234 and 236. This allows connection of various bonding pads on the dies 230 and 232 to the desired plated-through hole to provide for a ground connection or a $V_{cc}$ connection. This is provided through the HDI interconnect layer.

Figure 10:
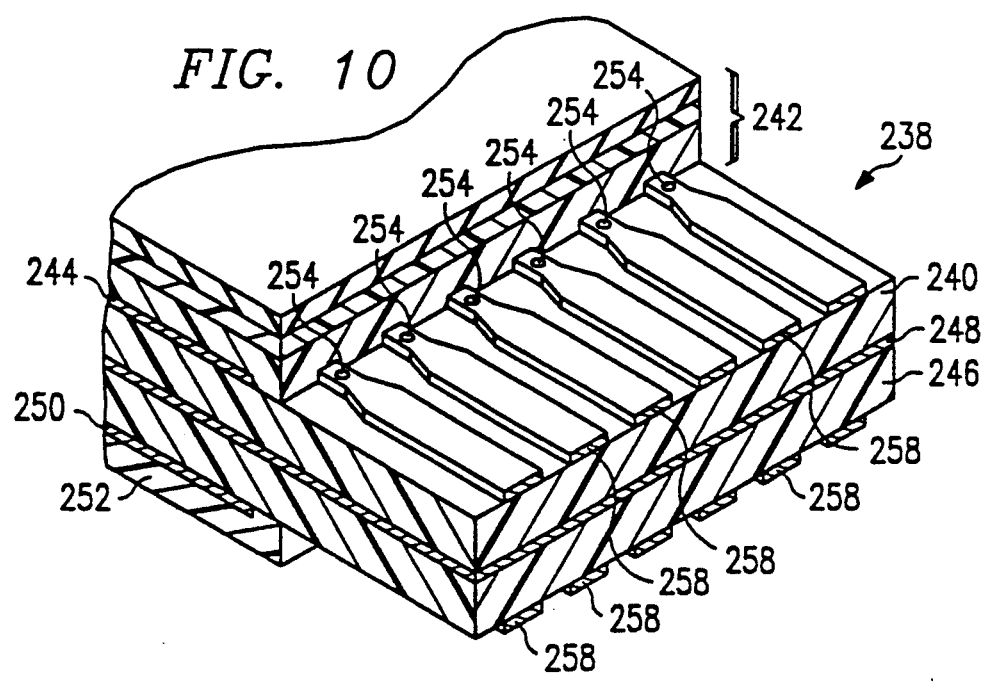
FIG. 10 illustrates an alternate connector configuration utilizing a card-edge connector.

Referring now to FIG. 10, there is illustrated an alternate embodiment of the connector arrangement. A module 238 is illustrated having a primary laminate layer 240 for supporting an HDI layer 242 and for housing integrated circuit components in cavities formed therein. The laminate layer 240 has a conductive layer 244 disposed on the surface thereof. The laminate layer 240 is laminated to an underlying support structure that is comprised of a laminate layer 246, an upper conductive layer 248 and a lower conductive layer 250. The lower conductive layer 250 has a Kapton ® layer 252 disposed on the lower layer thereof. The laminate layer 240 is laminated to the upper surface of the conductive layer 248. The HDI layer 242 is fabricated in accordance with the process as described above.

To form the connectors, a plurality of plated-through holes 254 are formed on one edge of the module. The conductive layer 244 and the conductive layer 250 are patterned to form a series of connector pins 258 that correspond to what is conventionally referred to as "edge connector". This allows the laminate layer utilized to contain the integrated circuit components and support the HDI layer and provide the core support while also providing for the connector itself. By patterning both sides of the module, the connector can be formed with the module.

Referring now to FIG. 11, there is illustrated an alternate of the present invention wherein the multi-chip module is fabricated on arcuate surface. A laminate structure is initially formed that is comprised of a primary laminate layer 260 for containing two die 262 and 264 within openings 268, respectively. The laminate layer 260 is initially fabricated with openings 266 and 268 and then laminated onto a core layer that is comprised of a laminate layer 270 with an upper conductive layer 272 and a lower conductive The core layer is fabricated in an arcuate shape such that, when the laminate layer 260 is laminated to the surface thereof, it has an also. The dies 262 and 264 are then adhesively attached to the surface conductive layer 272 and the openings 266 and 268, respectively, with an adhesive material that allows the surface of the die to tolerate the without putting undue stress on the die itself. Thereafter, an HDI layer formed on the upper surface of the primary layer 260 to provide the interconnect function with the Kapton ® layer 280 disposed on the lower surface lower conductive layer 274. This provides a module that can then be mounted much larger substrate 284, such as a telephone housing.

In summary, there has been provided a multi-chip integrated circuit module that utilizes a lower supporting layer fabricated from laminate having cavities formed therein for receiving integrated circuit chips. integrated circuit chips in the cavities are disposed such that they are co-planar with the upper surface of the supporting layer. The upper surface of the supporting layer has a conductive pattern formed thereon as does the surface of the supporting layer. Plated-through holes are formed between upper and lower surfaces of the supporting layers to provide for an interconnection level from the bottom conductive surface to the upper of the supporting layer. A high density interconnect layer is then formed upper surface of the supporting layer utilizing a plurality of layers of laminate material that are successively laminated onto the upper surface supporting structure. Vias are formed at select locations in each of the layers of laminate material and a conductive pattern formed over the thereof. This provides for multiple interconnect layers within the high-density interconnect layer that can be connected to both the integrated circuit within the cavities and the upper surface of the supporting layer including the plated-through holes. An I/O connector is integrally mounted onto the supporting structure to allow for interface with a system.

Although the preferred embodiment has been described in detail, it be understood that various changes, substitutions and alterations can be therein without departing from the spirit and scope of the invention as by the appended claims.

What is claimed is:

1. A method for fabricating a multi-chip integrated circuit package, comprising the steps of:
   providing first and second substrate layers of polymer material, the first substrate layer thinner than the second substrate layer;
   forming a plurality of cavities in the first substrate layer that extend through the first substrate layer;
   forming a thermally conductive layer on the upper surface of the second substrate layer;
   forming an electrically conductive layer on the lower surface of the second substrate layer;
   laminating the lower surface of the first substrate layer to the surface of the thermally conductive layer;
   forming a plurality of plated-through holes that extend from the upper surface of the first substrate layer to the electrically layer on the lower surface of the second substrate layer;
   disposing an integrated circuit chip in each of the cavities, the integrated circuit chips each having bonding pads associated therewith, integrated circuit chips adhered to the exposed surface of the thermally conductive layer in the associated cavity, with the upper surfaces of the circuit chips substantially co-planar with the surface of the first substrate
   disposing a thin polymer film over the upper surface of the first substrate layer and the integrated circuit chips and forming a plurality openings therein aligned with at least some of the bonding pads and the plated-through holes; and forming a pattern of interconnection conductors on the upper surface of the polymer film so as to extend between at least some of the openings and provide electrical connections between at least some of the bonding the plated through holes.

2. The method of claim 1, wherein the step of forming the thermally conductive layer on the upper surface of the second substrate comprises forming a layer of electrically conductive material on the surface of the second substrate layer.

3. The method of claim 1, and further comprising, electrically isolating select ones of the plated-through holes from the conductive the lower surface of the second substrate layer and interfacing an connector with the electrically isolated plated-through holes such that input/output connector is interfaced with the interconnection pattern on the upper surface of the polymer film, the input/output connector operable to isolated plated-through holes with an external system.

* * * * *